(12) United States Patent
Hailu et al.

(10) Patent No.: US 10,965,442 B2
(45) Date of Patent: Mar. 30, 2021

(54) LOW-POWER, LOW-LATENCY TIME-TO-DIGITAL-CONVERTER-BASED SERIAL LINK

(71) Applicant: QUALCOMM Incorporated, San Diego, CA (US)

(72) Inventors: Eskinder Hailu, Cary, NC (US); Bupesh Pandita, Cary, NC (US); Jon Boyette, Holly Springs, NC (US); Hadi Goudarzi, San Diego, CA (US); Yong Suk Jun, San Diego, CA (US); Zhi Zhu, San Diego, CA (US); Minhan Chen, Cary, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/150,123

(22) Filed: Oct. 2, 2018

(65) Prior Publication Data
US 2020/0106597 A1 Apr. 2, 2020

(51) Int. Cl.
*H04L 7/033* (2006.01)
*G04F 10/00* (2006.01)
*H04L 7/00* (2006.01)
*H03K 3/037* (2006.01)
*H03K 5/159* (2006.01)

(52) U.S. Cl.
CPC .......... *H04L 7/0331* (2013.01); *G04F 10/005* (2013.01); *H03K 3/037* (2013.01); *H03K 5/159* (2013.01); *H04L 7/0037* (2013.01)

(58) Field of Classification Search
None
See application file for complete search history.

(56) References Cited

U.S. PATENT DOCUMENTS

| | | | | |
|---|---|---|---|---|
| 6,281,725 B1 * | 8/2001 | Hanzawa | ............... | H03K 5/135 327/152 |
| 6,297,680 B1 * | 10/2001 | Kondo | ................... | H03K 5/133 327/276 |
| 8,284,887 B2 * | 10/2012 | Kikuchi | ................. | H03K 5/131 375/226 |

(Continued)

FOREIGN PATENT DOCUMENTS

| EP | 2264612 A2 * | 12/2010 | ........... G11C 7/1045 |
|---|---|---|---|
| EP | 2264612 B1 | 3/2016 | |

OTHER PUBLICATIONS

M. Zlatanski et al., A new high-resolution Time-to-Digital Converter concept based on a 128 stage 0.35 μm CMOS delay generator, IEEE, Oct. 2009, pp. 1-4 (Year: 2009).*

(Continued)

*Primary Examiner* — Berhanu Tadese
(74) *Attorney, Agent, or Firm* — Haynes and Boone, LLP

(57) ABSTRACT

A receiver is provided that includes a time-to-digital converter for converting a phase difference between a clock signal and a received data signal into a phase-difference digital code. The receiver also includes a logic circuit that controls a programmable delay line to delay the clock signal into a delayed clock signal by a delay that is responsive to a difference between the phase-difference code and a unit interval for the clock signal. The delayed clock signal clocks a flip-flop to register the received data signal.

17 Claims, 4 Drawing Sheets

(56) References Cited

U.S. PATENT DOCUMENTS

| | | | | |
|---|---|---|---|---|
| 8,446,191 B2* | 5/2013 | Dunworth | H03L 7/093 | 327/156 |
| 8,493,107 B2* | 7/2013 | Staszewski | H03K 5/131 | 327/141 |
| 8,825,424 B2* | 9/2014 | Rivoir | G04F 10/005 | 327/12 |
| 8,886,987 B2* | 11/2014 | Rivoir | G01R 31/31726 | 375/355 |
| 9,160,350 B2* | 10/2015 | Zerbe | G11C 7/1057 | |
| 9,292,036 B2* | 3/2016 | Grocutt | G06F 1/12 | |
| 9,341,673 B2* | 5/2016 | Rivoir | G01R 31/31726 | |
| 9,362,936 B1* | 6/2016 | Caffee | H03K 5/135 | |
| 9,531,394 B1* | 12/2016 | Caffee | H03L 7/1976 | |
| 9,660,653 B1* | 5/2017 | Khor | H03L 7/085 | |
| 9,748,960 B2* | 8/2017 | Zerbe | G11C 7/1093 | |
| 9,829,913 B2* | 11/2017 | Ramsey | G06F 1/12 | |
| 9,927,775 B1* | 3/2018 | Banin | G04F 10/005 | |
| 10,284,395 B2* | 5/2019 | Chiu | H04L 7/0037 | |
| 10,509,104 B1* | 12/2019 | Dato | G01S 7/032 | |
| 2003/0006750 A1* | 1/2003 | Roberts | G04F 10/06 | 324/76.53 |
| 2003/0053578 A1* | 3/2003 | Hinck | H03D 3/241 | 375/376 |
| 2004/0046589 A1* | 3/2004 | Gauthier | H03K 5/133 | 326/93 |
| 2004/0047441 A1* | 3/2004 | Gauthier | H04L 7/0008 | 375/376 |
| 2005/0001665 A1* | 1/2005 | Lin | H03K 5/1506 | 327/238 |
| 2007/0230513 A1* | 10/2007 | Talbot | G01R 31/316 | 370/516 |
| 2007/0232254 A1* | 10/2007 | Mackey | G06F 1/3237 | 455/343.1 |
| 2007/0234080 A1* | 10/2007 | Mackey | G06F 1/3203 | 713/300 |
| 2008/0172193 A1* | 7/2008 | Rhee | G01R 31/31709 | 702/69 |
| 2008/0272814 A1* | 11/2008 | Chiang | H03K 3/017 | 327/175 |
| 2008/0273528 A1* | 11/2008 | Maheshwari | H04L 7/0337 | 370/384 |
| 2008/0297216 A1* | 12/2008 | Chiang | G01R 31/3016 | 327/158 |
| 2009/0225631 A1* | 9/2009 | Shimizu | G04F 10/06 | 368/113 |
| 2009/0307518 A1* | 12/2009 | Hsieh | H03K 5/1534 | 713/501 |
| 2010/0134165 A1* | 6/2010 | Oh | G04F 10/06 | 327/158 |
| 2010/0171527 A1* | 7/2010 | Maeda | H03L 7/091 | 327/7 |
| 2010/0238278 A1* | 9/2010 | Rovegno | A61B 1/042 | 348/75 |
| 2010/0264963 A1* | 10/2010 | Kikuchi | H03L 7/081 | 327/157 |
| 2010/0310031 A1* | 12/2010 | Ballantyne | H03L 7/08 | 375/376 |
| 2010/0327916 A1* | 12/2010 | Ahmadi | H03L 7/0891 | 327/107 |
| 2010/0328130 A1* | 12/2010 | Bulzacchelli | H03M 1/20 | 341/166 |
| 2011/0022890 A1* | 1/2011 | Jeong | H04L 7/033 | 714/15 |
| 2011/0140737 A1* | 6/2011 | Rivoir | G04F 10/005 | 327/12 |
| 2011/0197086 A1* | 8/2011 | Rivoir | G01R 31/3193 | 713/500 |
| 2011/0202296 A1* | 8/2011 | Yamamoto | G01R 31/31726 | 702/79 |
| 2011/0248874 A1* | 10/2011 | Cannillo | G04F 10/005 | 341/118 |
| 2013/0049810 A1* | 2/2013 | Lu | H03K 5/135 | 327/43 |
| 2014/0253349 A1* | 9/2014 | Choi | H03M 1/50 | 341/116 |
| 2014/0347941 A1* | 11/2014 | Jose | H03L 7/093 | 365/191 |
| 2014/0375486 A1* | 12/2014 | Chaivipas | H03M 1/0624 | 341/118 |
| 2015/0039927 A1* | 2/2015 | Rivoir | G01R 31/31726 | 713/400 |
| 2015/0188553 A1* | 7/2015 | Familia | H03L 7/097 | 327/5 |
| 2015/0263850 A1* | 9/2015 | Asada | G06F 1/04 | 375/371 |
| 2016/0056827 A1* | 2/2016 | Vlachogiannakis | H03B 5/1296 | 327/158 |
| 2016/0105165 A1* | 4/2016 | Shim | G04F 10/005 | 327/175 |
| 2017/0149555 A1* | 5/2017 | Cohen | H04L 1/243 | |
| 2017/0193136 A1* | 7/2017 | Prasad | G06F 30/327 | |
| 2017/0288656 A1* | 10/2017 | Cho | H03K 5/1565 | |
| 2017/0315582 A1* | 11/2017 | Zhang | H04J 3/0661 | |
| 2018/0102779 A1* | 4/2018 | Behel | H03L 7/0814 | |
| 2018/0110018 A1* | 4/2018 | Yu | H04L 7/04 | |
| 2018/0115406 A1* | 4/2018 | Moore | G04F 10/005 | |
| 2019/0004563 A1* | 1/2019 | Nelson | H03L 7/0814 | |
| 2019/0004565 A1* | 1/2019 | Nelson | H03L 7/0814 | |
| 2019/0007052 A1* | 1/2019 | Nelson | H03L 7/0807 | |
| 2019/0007055 A1* | 1/2019 | Nelson | G06F 1/12 | |
| 2019/0007191 A1* | 1/2019 | Wang | H03L 7/00 | |
| 2019/0028108 A1* | 1/2019 | Gao | H03L 7/0891 | |
| 2019/0052278 A1* | 2/2019 | Pandita | G06F 1/08 | |
| 2019/0165792 A1* | 5/2019 | Huh | H03L 7/0816 | |
| 2019/0268004 A1* | 8/2019 | Mayer | H03L 7/0992 | |

OTHER PUBLICATIONS

Santos et al., A CMOS delay locked loop and sub-nanosecond time-to-digital converter chip, IEEE 1996, vol. 43, No. 3, pp. 1717-1719 (Year: 1996).*

* cited by examiner

LOW-POWER, LOW-LATENCY TIME-TO-DIGITAL-CONVERTER-BASED SERIAL LINK

TECHNICAL FIELD

This application relates to serial links, and more particularly to a time-to-digital-converter (TDC)-based serial link having low-latency and reduced power consumption.

BACKGROUND

In source-synchronous systems, it is conventional for the receiver to align a clock signal with the data using a phase interpolator. In such systems, the receiver includes a phase detector that detects the phase between the clock signal and the data. A loop filter filters the phase detector output to produce a filtered phase difference so that the clock signal may be interpolated according to the filtered phase difference. The clock signal interpolation keeps the interpolated or aligned clock signal centered in the data eye so that the data may be sampled accordingly.

But the operation of the phase interpolator consumes substantial power. It is thus conventional for low-power serial links to be implemented without the phase-interpolated clock alignment discussed above. In such a simplified source-synchronous system, a master device includes a clock source such as a phase-locked loop (PLL). The clock source in the master device transmits a PLL clock signal across a channel having a propagation delay $\tau$ to a slave device having a clock receiver for receiving the transmitted PLL clock signal. A transmitter in the master device transmits data synchronously with the PLL clock signal across the channel to a receiver in the slave device that samples the received data using the received clock signal. In turn, a transmitter in the slave device transmits data across the channel back to the master device responsive to the received clock signal. The transmitted data from the slave device is also subjected to the propagation delay of $\tau$ from the propagation across the channel. A master device receiver samples the data from the slave device transmitter responsive to the PLL clock signal.

The resulting serial transmission is low power because no phase interpolation is needed in the slave device nor in the master device. But this low power operation is limited by the roundtrip propagation delay of $2\tau$ from the master device to the slave device and then back from the slave device to the master device. In particular, suppose that the clock period (and thus the data period) is also $2\tau$. The master device receiver will then be sampling the data from the slave device transmitter at the boundary between a current bit and a subsequent bit, which leads to timing violations and errors. Conventional low-power serial link data speeds are thus limited to a frequency of no greater than $\frac{1}{2}\tau$.

Accordingly there is a need in the art for improved low-power source-synchronous systems that do not require phase interpolators.

SUMMARY

A receiver for a source-synchronous system is provided that includes a time-to-digital converter (TDC) for converting a unit interval (UI) phase measurement representing a unit interval of an input clock signal into a unit-interval digital code. The TDC forms the unit-interval digital code during a measurement phase of operation. In addition, the TDC converts a phase difference between a received serial data signal and the input clock signal into a phase-difference digital code during the measurement mode.

With the unit interval and the phase difference thus measured in the measurement mode, the receiver may transition to a calibration mode in which the receiver aligns a delayed version of an input clock signal from a clock source. In particular, a logic circuit adjusts a programmable delay line to delay the input clock signal into a delayed clock signal based upon a difference between the phase-difference digital code and the unit-interval digital code. The delay applied to the delayed clock signal positions a sampling clock edge of the delayed clock signal within the data eye for the received data signal. With the sampling clock edge thus aligned or calibrated in the calibration phase, the receiver may proceed to sample the received serial data signal using the delayed clock signal in a normal mode of operation.

The resulting sampling of the received serial data signal by the delayed clock signal is thus centered appropriately within the data eye without the use of a phase interpolator or a clock data recovery circuit. The serial link data rate for the receiver may thus be advantageously high yet the operation of the receiver is relatively low power.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
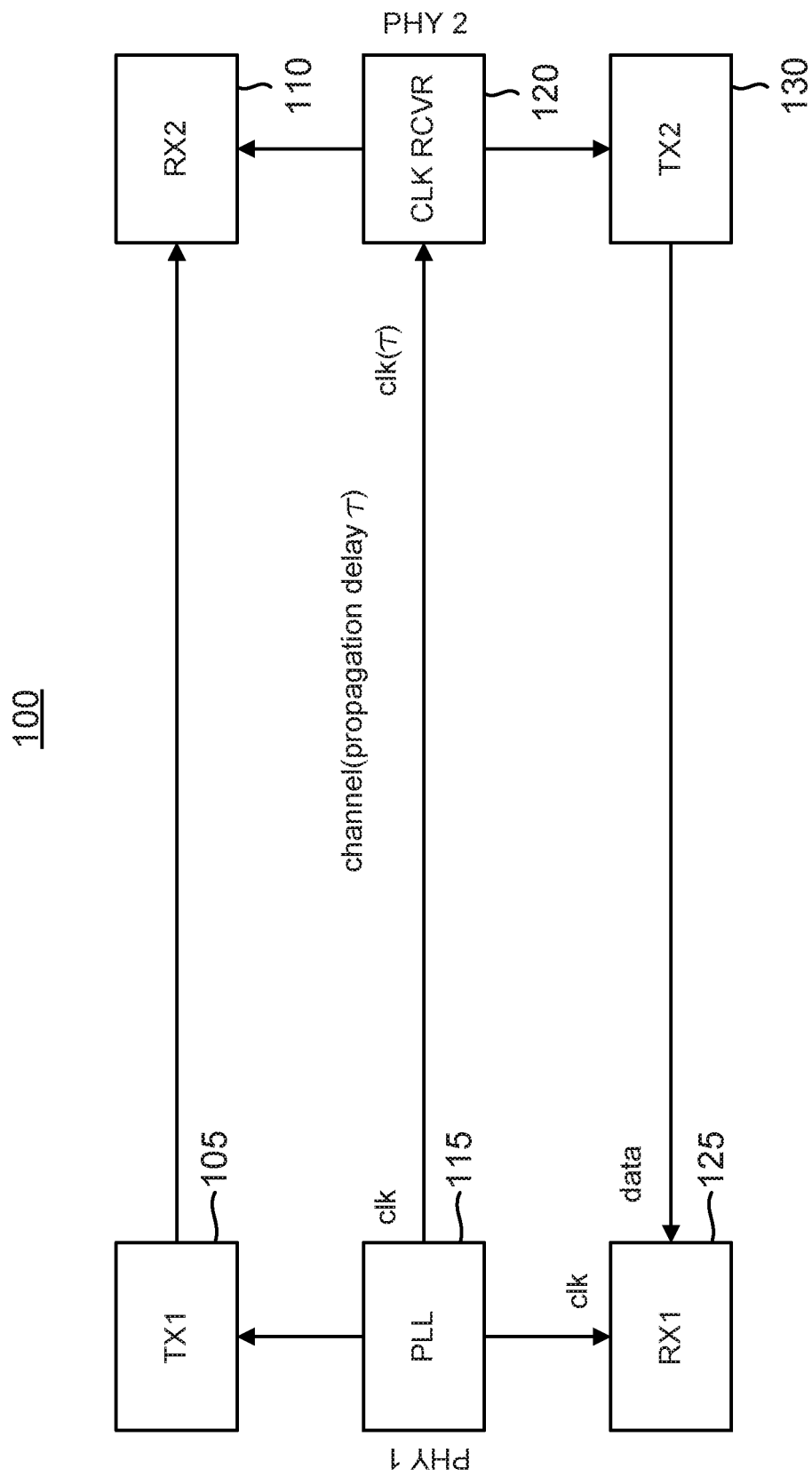
FIG. 1 illustrates a source-synchronous communication system in accordance with an aspect of the disclosure.

Turning now to the drawings, an example system 100 shown in FIG. 1 includes a master device (physical layer 1 (PHY 1)) that includes a phase-locked loop (PLL) 115 as a clock source for sending a source-synchronous clock signal to a slave device (PHY 2). The designation of "master" within system 100 merely denotes which device has the clock source. PLL 115 also clocks a transmitter (TX1) 105 in the master device that transmits data synchronously with the clock signal across the channel to a slave device receiver (RX2) 110. A clock receiver (CLK RCVR) 120 in the slave device receives the transmitted clock signal and clocks a slave device receiver 110 with the received clock signal so that slave device receiver 110 may sample the serial data transmitted by master device transmitter 105 using the received clock signal. Clock receiver 120 also clocks a slave device transmitter (TX2) 130 that transmits data across the channel to the master device responsive to the received clock signal. In the master device, PLL 115 clocks a master device receiver (RX1) 125 so that master device receiver 125 may sample the data transmitted from slave device transmitter 130.

Neither slave device receiver 110 nor the master device receiver 125 includes a phase interpolator so that low-power operation is achieved. But the clock signal (clk(τ)) received by slave device receiver 110 is delayed by a propagation delay oft with respect to the PLL clock signal (clk) generated by PLL 115. Since this delayed clock signal is clocking slave device transmitter 130, which then transmits data subject to the propagation delay of τ across the channel to master device receiver 125, the data received by master device receiver 125 is subject to a roundtrip propagation delay of 2τ. In a conventional source-synchronous system, the data rate for the serial link data transmission from the master device to the slave device (or for the data transmission from the slave device to the master device) would be thus limited to a frequency of ½τ or less as discussed earlier. But master device receiver 125 is configured to align the clock signal from the PLL 115 to the received data without the use of a phase interpolator such that this conventional limit on the data speed transmission is obviated yet low-power operation is maintained. It will be appreciated that slave device receiver 110 may also be configured to align the received clock signal in this fashion. Thus, although the following discussion will focus on master device receiver 125, it will be appreciated that the techniques and principles disclosed herein are also applicable to slave device receiver 110.

Master device receiver 125 is configured to operate in three modes of operation: a measurement mode, a calibration mode, and a normal mode of operation. The measurement mode and the calibration mode take place before the normal mode of operation during which the master and slave devices exchange their serial data. The calibration mode takes place after the measurement mode of operation. The measurement mode will be addressed first followed by a discussion of the calibration mode of operation.

The Measurement Mode

Figure 2:
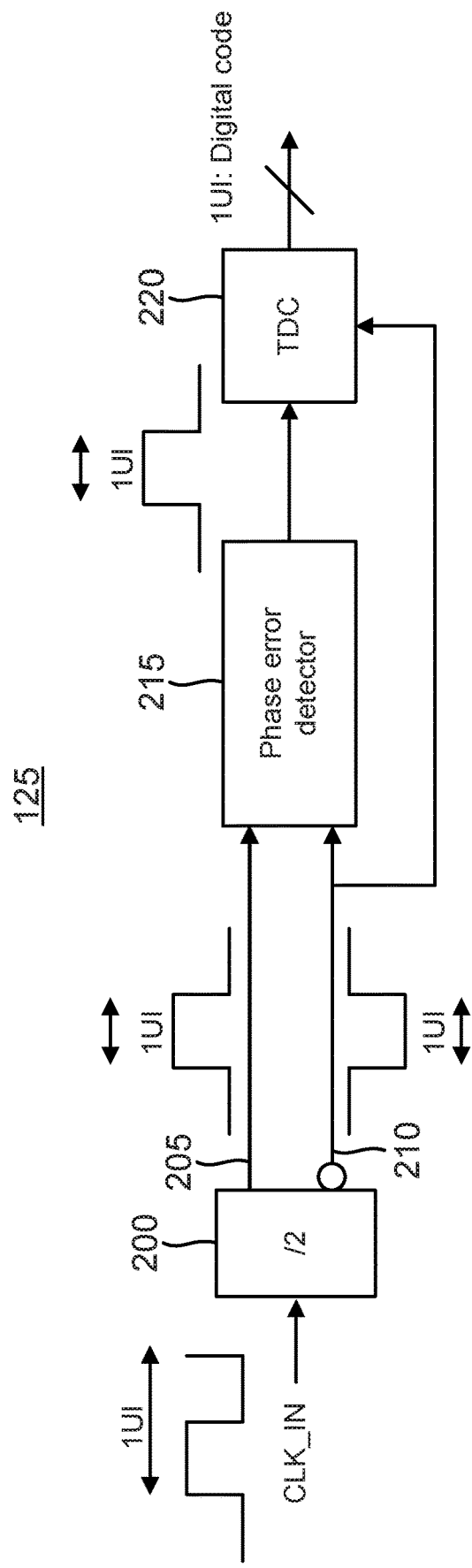
FIG. 2 illustrates operation of the master device receiver in the system of FIG. 1 during a calibration mode of operation in accordance with an aspect of the disclosure.

During the measurement mode, master device receiver 125 measures the unit interval (UI) for the PLL clock signal as shown in FIG. 2 (it will be appreciated that other types of clock sources may be used instead of PLL 115). The PLL clock signal is also denoted as an input clock signal in the following discussion. To remove any duty-cycle distortion, a divide-by-two divider circuit 200 divides the PLL clock signal into a divided-by-two clock signal 205 and its complement 210. Due to the divide-by-two division, a half cycle of divided-by-two clock signal 205 and its complement 210 will equal the UI (the period) of the input clock signal. A phase detector 215 determines a UI phase difference between divided-by-two clock signal 205 and its complement 210. Phase detector 215 may also be denoted as a phase error detector. The UI phase difference is responsive to the UI for the input clock signal. A time-to-digital converter (TDC) 220 converts the UI phase difference from phase detector 215 into a unit-interval digital code that represents the length of the UI for the PLL clock signal. Note that the term UI may also be used interchangeably with the clock period for the input clock signal. As will be explained further below, this measurement of the UI is quite advantageous because it may be used during the calibration mode of operation to adjust or calibrate a delayed version of the input clock signal so that the received data may be sampled appropriately within the data eye (e.g., at the middle of the unit interval).

Figure 3:
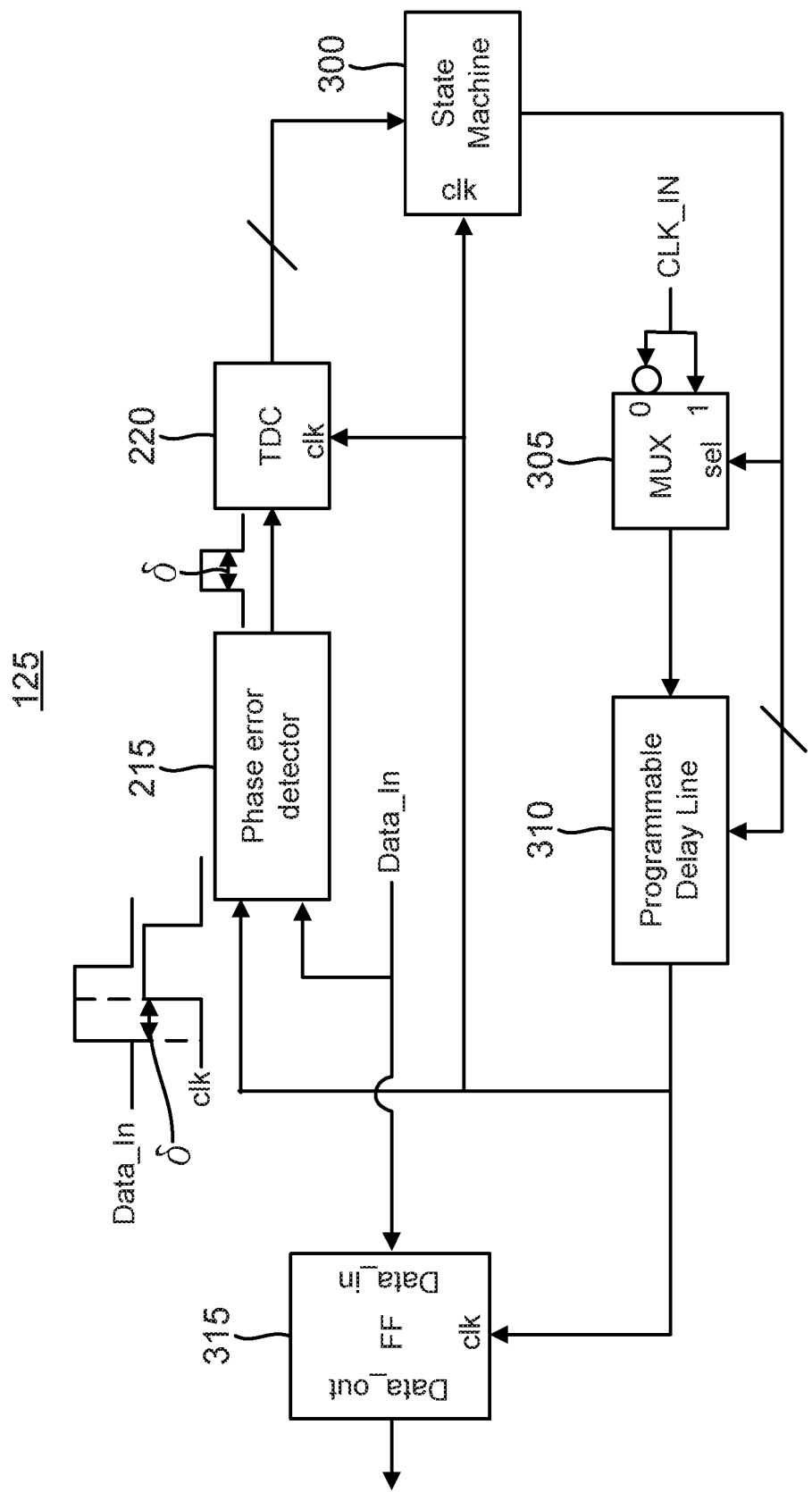
FIG. 3 illustrates operation of the master device receiver in the system of FIG. 1 during a normal mode of operation in accordance with an aspect of the disclosure.

During the measurement mode, master device receiver 125 also determines a phase-difference digital code that represents a phase difference between the input clock signal (or the complement of the input clock signal) and the received data signal. To provide an edge-to-edge comparison between the received data signal and the input clock signal, slave transmitter 130 (FIG. 1) is configured to transmit the data signal during the measurement mode as an alternating series of binary ones and binary zeros to match the binary transition of the input clock signal. Phase detector 215 then measures a phase difference δ between edges of the input clock signal and corresponding edges of the received data signal (Data_In) as shown in FIG. 3. TDC 220 converts this measured phase difference δ into a corresponding phase-difference digital code. With both the unit interval and the phase difference measured as represented by the corresponding digital codes, the calibration mode may then proceed as follows.

The Calibration Mode

In the calibration phase, the receiver delays the input clock signal into a delayed clock signal that has a sampling edge (which may be either a rising edge or a falling edge) appropriately positioned within the data eye for the received data signal. For example, suppose that the UI digital code is 100 code units. The center of the data eye would thus be 50 code units, which is half of the UI. If the phase-difference digital code is 25 code units in such an example, then a delay corresponding to 25 TDC code units would position the sampling clock edge for the delayed clock signal in the middle of the data eye. Should the measured phase difference as represented by the phase-difference digital code be greater than ½ of the UI digital code, the delay is instead applied to a complement of the input clock signal. In this fashion, whatever clock edge is best (rising or falling) is centered within the data eye so that the received serial data may be sampled accordingly.

A clock source such as PLL 115 of FIG. 1 provides the input clock signal (CLK_IN). As further shown in FIG. 3, a multiplexer 305 selects between the input clock signal and its inverse depending upon the relationship between the phase-difference digital code and the unit-interval digital code. To control the selection by multiplexer 305, a logic circuit such as a state machine 300 compares the phase-difference digital code to the unit-interval digital code. In one implementation, state machine 300 is configured to control multiplexer 305 to select for the input clock signal responsive to the phase-difference digital code being less than or equal to 50% of the unit-interval digital code and to select for the inverted input clock signal responsive to the phase-difference digital code being greater than 50% of the unit-interval digital code. Note that such a configuration places the sampling clock edge for the data in the middle of the data eye. But it will be appreciated that the techniques and circuits disclosed herein enable a user to place the sampling clock edge wherever it is desired within the data eye such that the sampling clock edge may be adjusted to be prior to or after the middle of the data eye (50% of the UI).

State machine 300 also controls the delay applied to the selected clock signal from multiplexer 305 by a programmable delay line 310 responsive to a comparison of the phase-difference digital code to the unit-interval code. For example, suppose that the comparison indicates that the rising edge for the input clock signal occurs at 25% of the UI. In such a case, state machine 300 may configure programmable delay line 310 to apply a delay of 25% of the UI to the selected clock signal to form a delayed clock signal so that the received data may be sampled in the middle of the data eye. Conversely, if the comparison indicates that the rising edge for the input clock signal occurs at 75% of the unit interval, a delay of 25% of the UI to the inverted input clock signal would again place the delayed clock signal's rising edge at 50% of the UI. In one implementation, time-to-digital converter 220, state machine 300, and programmable delay line 310 may be deemed to comprise a means for converting the phase difference δ into the phase-difference digital code and for delaying the input clock signal into a delayed clock signal by a delay responsive to a difference between the phase-difference digital code and a unit interval for the input clock signal. With the delayed clock signal from programmable delay line 310 thus calibrated, a normal mode of operation may ensue as follows.

The Normal Mode of Operation

During the normal mode of operation, the master device and slave device exchange serial data as discussed with reference to system 100 of FIG. 1. Master device transmitter 105 thus transmits serial data to the slave device receiver 110 responsive to the PLL clock signal. PLL 115 also transmits the clock signal to the slave device clock receiver 120, which then clocks slave device transmitter 130 with the received clock signal. Master device receiver 125 then samples the serial data transmitted from slave device transmitter 130 using the delayed clock signal that was calibrated during the calibration phase. Referring again to FIG. 3, the delayed clock signal clocks a flip-flop 315 that registers the received data responsive to the rising edges of the delayed clock signal. It will be appreciated that the falling edge of the delayed clock signal may be used to clock flip-flop 315 in alternative implementations. In some implementations, operation of the normal mode may be periodically interrupted so that the unit interval and phase difference may be re-measured in a repeat of the measurement phase. The delay applied by programmable delay line 310 would then be recalibrated in a repeat of the calibration mode, whereupon normal operation could again resume. In alternative implementations, the normal mode is not interrupted until a power-down or reset operation for the master device is performed.

The resulting serial link data transmission is very power efficient since no clock data recovery (CDR) operation or phase interpolation of a clock signal is necessary yet also enables the data rate to exceed the conventional roundtrip propagation limit of 1/(2τ). In particular, the data rate for system 100 is only subject to the resolution of TDC 220. At a data rate of 1 GB per second, the UI would be 1000 ps. Since a typical resolution for TDC 220 is 25 ps (one gate delay), such a resolution is just 2.5% of the UI at the 1 GB per second data rate, which leaves an abundant margin. If the measurement of the UI is only performed at startup and not updated in light of voltage and temperature drifts, another margin of 25 ps may be sufficient to account for such drifts. The resulting margin of 50 ps is still only 5% of the 1000 ps UI, which provides plenty of operating margin.

Figure 4:
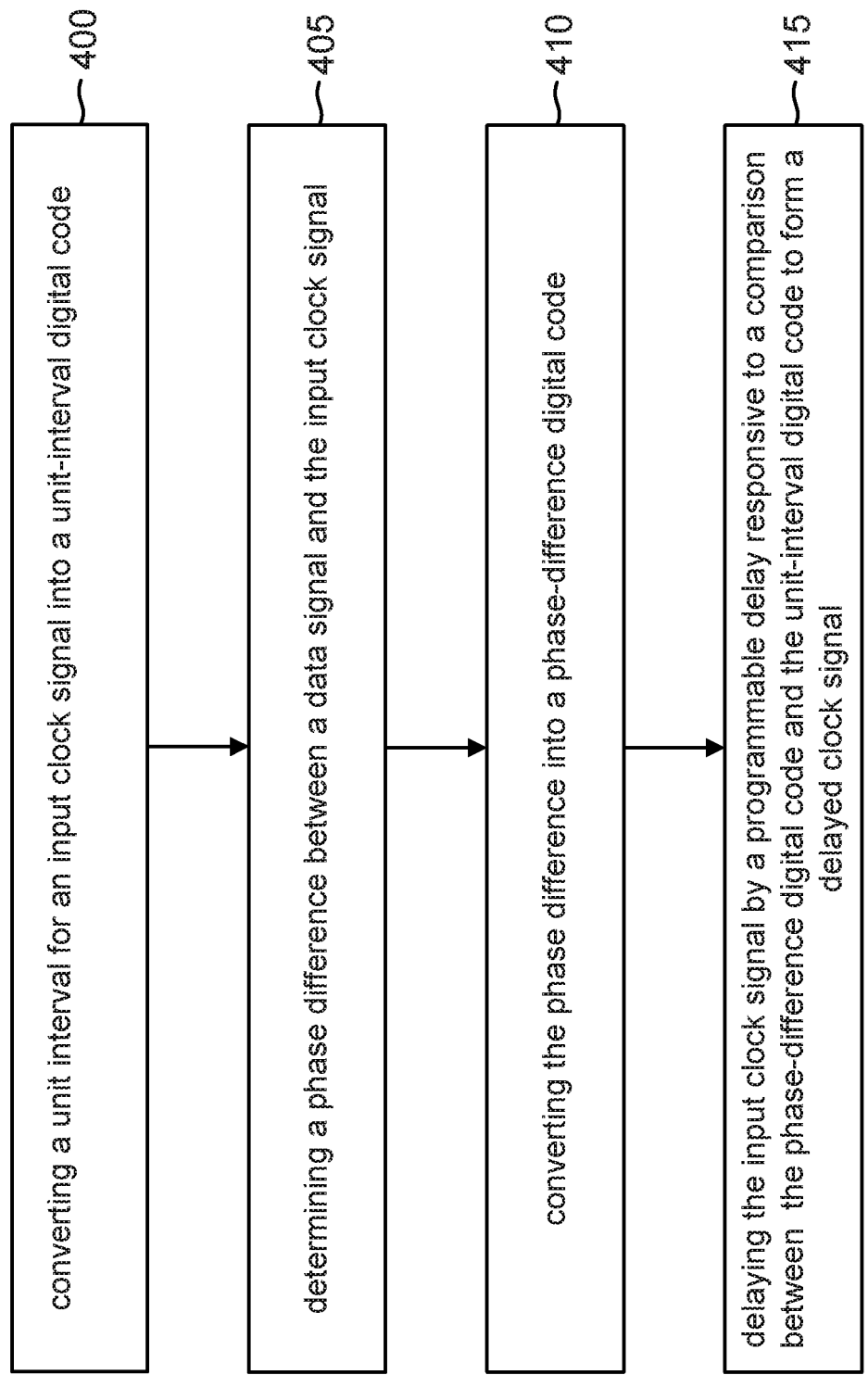
FIG. 4 is a flowchart for a method of aligning a clock signal with a data eye for a received data stream in accordance with an aspect of the disclosure.

An example method of operation for delaying a clock signal in a source-synchronous receiver will now be discussed with reference to the flowchart of FIG. 4. The method includes an act 400 of converting a unit interval for an input clock signal into an unit-interval digital code. The conversion of the unit interval for the PLL clock signal into the unit-interval digital code as discussed with reference to FIG. 2 is an example of this act. The method further includes an act 405 of determining a phase difference between a data signal and the input clock signal. The operation of phase detector 215 to measure the phase difference δ is an example of act 405. In addition, the method includes an act 410 of converting the phase difference into a phase-difference digital code. The operation of TDC 220 to convert the phase difference δ into a phase-difference digital code as discussed with reference to FIG. 3 is an example of act 410. Finally, the method includes an act 415 of delaying the input clock signal by a programmable delay responsive to a comparison between the phase-difference digital code and the unit-interval digital code to form a delayed clock signal. The delaying of the input clock signal in programmable delay line 310 is an example of act 415.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A receiver, comprising:
   a phase detector configured to determine a phase difference between a received data signal and an input clock signal;
   a time-to-digital converter configured to convert the phase difference into a phase-difference digital code and to convert a clock period of the input clock signal into a clock-period digital code;
   a programmable delay line configured to delay a clock signal by a delay to form a delayed clock signal;
   a flip-flop configured to be clocked by the delayed clock signal to register the received data signal; and
   a logic circuit configured to control the delay for the programmable delay line responsive to a difference between the phase-difference digital code and the clock-period digital code.

2. The receiver of claim 1, wherein the logic circuit comprises a state machine.

3. The receiver of claim 1, further comprising:
   a multiplexer configured to select between the input clock signal and a complement of the input clock signal to form a selected clock signal, wherein the logic circuit is further configured to control the selection by the multiplexer responsive to the difference between the phase-difference digital code and the clock-period digital code, and wherein the programmable delay line is further configured to delay the selected clock signal to form the delayed clock signal.

4. The receiver of claim 3, further comprising a clock source configured to provide the input clock signal.

5. The receiver of claim 4, wherein the clock source is a phase-locked loop.

6. The receiver of claim 3, wherein the logic circuit is further configured to control the multiplexer to select for the input clock signal responsive to the phase-difference digital code being less than one-half of the clock-period digital code.

7. The receiver of claim 6, wherein the logic circuit is further configured to control the multiplexer to select for the complement of the input clock signal responsive to the phase-difference digital code being greater than one-half of the clock-period digital code.

8. A method of receiving a data signal, comprising;
   converting a clock period of an input clock signal into a clock-period digital code;
   determining a phase difference between the data signal and the input clock signal;
   converting the phase difference into a phase-difference digital code;

delaying the input clock signal by a delay responsive to the difference between the phase-difference digital code and the clock-period digital code to form a delayed clock signal;

controlling the delay responsive to a difference between the phase difference digital code and the clock-period digital code, and registering the data signal responsive to the delayed clock signal.

9. The method of claim 8, further comprising:

selecting between an input clock signal and a complement of the input clock signal to form a selected clock signal, wherein the delaying of the input clock signal by the programmable delay responsive to the difference between the phase-difference digital code and the clock-period digital code to form the delayed clock signal comprises delaying the selected clock signal by the programmable delay.

10. The method of claim 9, wherein the selecting between the input clock signal and the complement of the input clock signal to form the selected clock signal comprises selecting for the input clock signal responsive to the phase-difference digital code being less than one-half of the clock-period digital code.

11. The method of claim 10, wherein the selecting between the input clock signal and the complement of the input clock signal to form the selected clock signal further comprises selecting for the complement of the input clock signal responsive to the phase-difference digital code being greater than one-half of the clock-period digital code.

12. The method of claim 8, wherein the converting the clock period for the input clock signal into the clock-period digital code comprises converting the clock period in a time-to-digital converter.

13. The method of claim 8, further comprising:

dividing an input clock signal by two to form a divided clock signal; and detecting a phase difference between the divided clock signal and a complement of the divided clock signal to form a detected phase difference, wherein the converting of the clock period for the input clock signal into the clock-period digital code comprises converting the detected phase difference into the clock-period digital code.

14. A receiver, comprising:

a phase detector configured to determine a first phase difference between a received data signal and an input clock signal and a second phase difference between a divided version of the input clock signal and a complement of the divided version of the input clock signal;

means for converting the first phase difference into a phase-difference digital code and for converting the second phase difference into a clock-period digital code;

means for delaying the input clock signal into a delayed clock signal by a programmable delay responsive to a difference between the phase-difference digital code and the clock-period digital code; and a flip-flop configured to be clocked by the delayed clock signal to register the received data signal.

15. The receiver of claim 14, further comprising a clock source configured to provide the input clock signal.

16. The receiver of claim 15, wherein the clock source comprises a phase-locked loop.

17. The receiver of claim 15, wherein the receiver is integrated into a master device further comprising a transmitter configured to transmit a transmitted data signal to a slave device responsive to the input clock signal.

* * * * *